United States Patent
Takano

(10) Patent No.: US 10,949,121 B2
(45) Date of Patent: Mar. 16, 2021

(54) MEMORY SYSTEM

(71) Applicant: TOSHIBA MEMORY CORPORATION, Minato-ku (JP)

(72) Inventor: Takayuki Takano, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 259 days.

(21) Appl. No.: 16/282,816

(22) Filed: Feb. 22, 2019

(65) Prior Publication Data

US 2020/0026466 A1 Jan. 23, 2020

(30) Foreign Application Priority Data

Jul. 23, 2018 (JP) .............................. JP2018-137913

(51) Int. Cl.
*G06F 3/06* (2006.01)
*G11C 16/04* (2006.01)
*G11C 16/26* (2006.01)
*G11C 16/10* (2006.01)
*G11C 16/14* (2006.01)

(52) U.S. Cl.
CPC .......... *G06F 3/0659* (2013.01); *G06F 3/0613* (2013.01); *G06F 3/0679* (2013.01); *G11C 16/0483* (2013.01); *G11C 16/10* (2013.01); *G11C 16/14* (2013.01); *G11C 16/26* (2013.01)

(58) Field of Classification Search
CPC .... G06F 3/0659; G06F 3/0613; G06F 3/0679; G06F 3/061; G06F 3/0688; G06F 13/1642
See application file for complete search history.

(56) References Cited

U.S. PATENT DOCUMENTS

| 6,076,125 A * | 6/2000 | Anand ................... G06F 9/52 710/107 |
| 6,144,616 A * | 11/2000 | Suzuki ................ G11C 7/1072 365/189.05 |
| 8,838,879 B2 | 9/2014 | Yoshida |
| 8,996,782 B2 | 3/2015 | Ide et al. |
| 2018/0307597 A1 * | 10/2018 | Oh .......................... G06F 3/061 |

FOREIGN PATENT DOCUMENTS

| JP | 2002-268942 | 9/2002 |
| JP | 2012-68936 | 4/2012 |
| JP | 2013-200678 | 10/2013 |

* cited by examiner

*Primary Examiner* — Reginald G Bragdon
*Assistant Examiner* — Thanh D Vo
(74) *Attorney, Agent, or Firm* — Oblon, McClelland, Maier & Neustadt, L.L.P.

(57) ABSTRACT

A memory system includes a memory chip, a queue block and a memory controller. The queue block is configured to store a command to be transmitted to the memory chip. The queue block includes a first queue and a plurality of second queues each corresponding to a plane of the memory chip. The memory controller is configured to determine whether or not a first command enqueued in the first queue is a first read command. The first read command is a command for executing read operation in the planes asynchronously. When the first command is the first read command, the memory controller transfers the first command to one of the second queues corresponding to a plane in which the first command is to be executed. The memory controller selects the first queue or the second queues as a source of a command to be transferred to the memory chip.

16 Claims, 10 Drawing Sheets

FIG.6

| | | 151 |
|---|---|---|
| | | |
| | | |
| 320 | Read | - |
| 310 | Write | - |
| 300d | Read | PLANE #3 | 400d |
| 300c | Read | PLANE #2 | 400c |
| 300b | Read | PLANE #1 | 400b |
| 300a | Read | PLANE #0 | 400a |

US 10,949,121 B2

MEMORY SYSTEM

CROSS-REFERENCE TO RELATED APPLICATIONS

This application is based upon and claims the benefit of priority from Japanese Patent Application No. 2018-137913, filed on Jul. 23, 2018; the entire contents of which are incorporated herein by reference.

FIELD

Embodiments described herein relate generally to a memory system.

BACKGROUND

Conventionally, semiconductor memories such as a NAND flash memory are known. In such a semiconductor memory, a single memory chip may be divided to multiple planes that are operable in parallel.

BRIEF DESCRIPTION OF THE DRAWINGS

FIG. 6 is a view illustrating an example of a data structure of various commands stored in a main queue according to the first embodiment;

DETAILED DESCRIPTION

In general, according to an embodiment, a memory system includes a memory chip, a queue block and a memory controller. The memory chip includes a plurality of planes. The queue block is configured to store a command to be transmitted to the memory chip. The queue block includes a first queue and a plurality of second queues. The second queues respectively correspond to the planes of the memory chip. The memory controller is configured to determine whether or not a first command enqueued in the first queue is a first read command. The first read command is a command for executing read operation in the planes asynchronously. When determining that the first command is the first read command, the memory controller transfers the first command to one of the second queues corresponding to a plane in which the first command is to be executed. When determining that the first command is not the first read command, the memory controller refrains from transferring the first command from the first queue so that the first command remains in the first queue. The memory controller is configured to select the first queue or the second queues as a source of a command to be transferred to the memory chip.

Hereinafter, memory systems according to embodiments will be described in detail with reference to the accompanying drawings. The embodiments are merely exemplary and not intended to limit the scope of the invention.

First Embodiment

Figure 1:
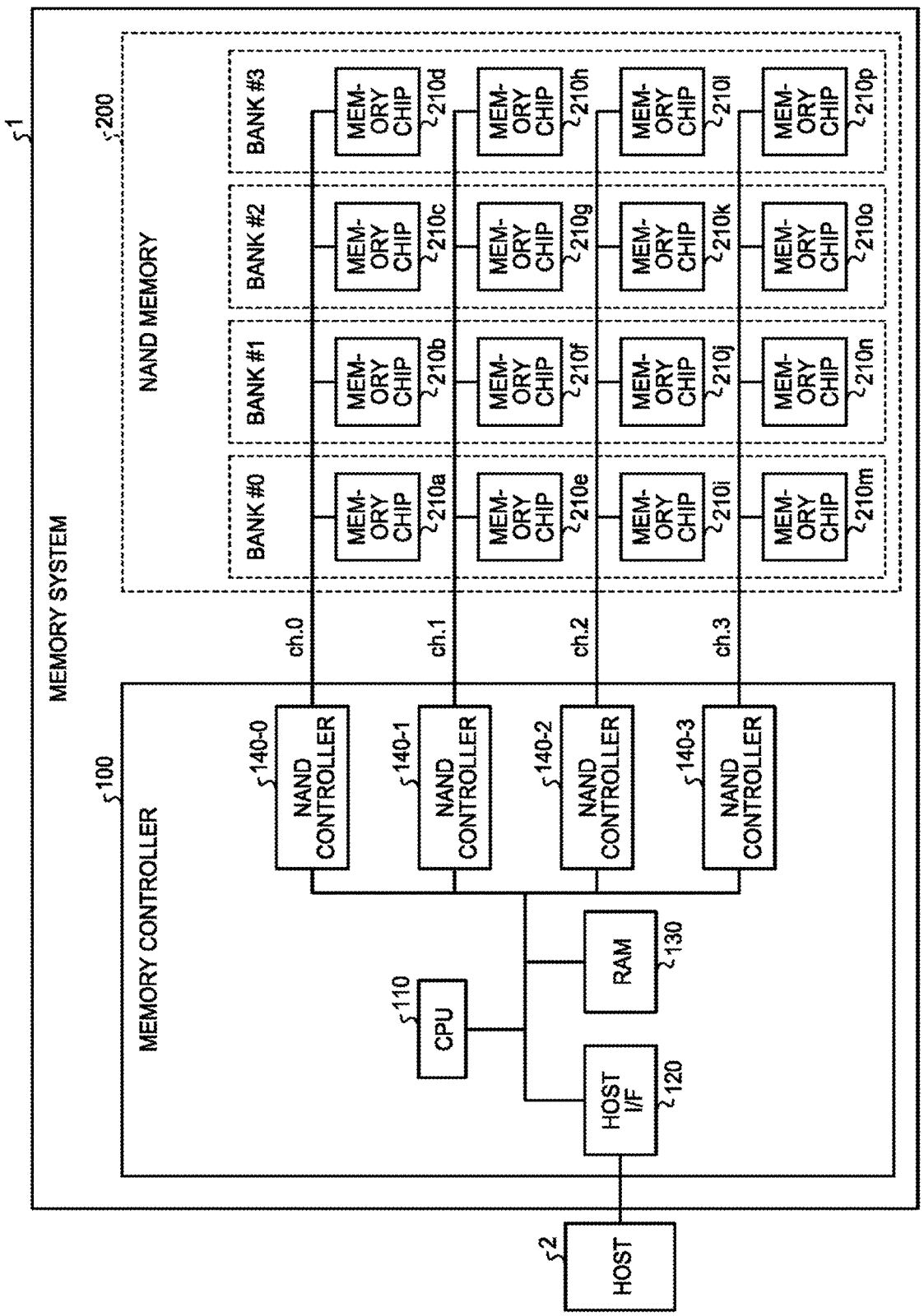
FIG. 1 is a view illustrating a schematic configuration of a memory system according to a first embodiment.

FIG. 1 is a view illustrating the configuration of a memory system according to a first embodiment. A memory system 1 can be connected to a host 2. The interface standard between the memory system 1 and the host 2 is not limited to a specific standard. As one example, serial attached SCSI (SAS) can be employed.

The host 2 represents a personal computer, a portable information terminal, or a server, for example. The memory system 1 can accept an access request, such as a read request and a write request, from the host 2.

The memory system 1 includes a memory controller 100, and a NAND flash memory (NAND memory) 200. The NAND memory 200 includes a plurality of memory chips 210. The memory chips 210 are not limited to the NAND flash memory.

The NAND memory 200 includes the plurality of memory chips 210, i.e., sixteen memory chips 210a to 210p. Each of the sixteen memory chips 210, which constitute the NAND memory 200, is connected to a memory controller 100 through one of four channels (ch.0 to ch.3).

In the example illustrated in FIG. 1, the memory chips 210a to 210d are commonly connected to a channel #0 (ch.0). The memory chips 210e to 210h are commonly connected to a channel #1 (ch.1). The memory chips 210i to 210l are commonly connected to a channel #2 (ch.2). The memory chips 210m to 210p are commonly connected to a channel #3 (ch.3).

Each of the channels includes a wiring group including I/O signal lines and control signal lines. The I/O signal lines are, for example, signal lines through which data, addresses, and commands are transmitted and received. The control signal lines are, for example, signal lines through which a write enable (WE) signal, a read enable (RE) signal, a command latch enable (CLE) signal, an address latch enable (ALE) signal, a write protection (WP) signal, and a chip enable (CE) signal or a chip select (CS) signal are transmitted and received.

The memory controller 100 can individually control the channels. The memory controller 100 can simultaneously control the channels to thereby simultaneously operate the memory chips 210 which are connected to different channels.

The NAND memory 200 further includes a plurality of banks. Each of the four memory chips 210 connected to each of the channels is, for example, included in any of the plurality of banks.

In the example illustrated in FIG. 1, the NAND memory 200 includes four banks (banks #0 to #3) by way of example. The four memory chips 210a, 210e, 210i, and 210m constitute the bank #0. The four memory chips 210b, 210f, 210j, and 210n constitute the bank #1. The four memory chips

210c, 210g, 210k, and 210o constitute the bank #2. The four memory chips 210d, 210h, 210l, and 210p constitute the bank #3. That is, in the example illustrated in FIG. 1, the four individual memory chips 210 connected to one channel pertain to different banks.

One bank may include one or more planes as described later. In the following, it is assumed that one bank includes one memory chip 210.

The memory controller 100 can efficiently operate the memory chips of the different banks connected to the same channel.

For example, the memory controller 100 transmits a command to a memory chip 210 of the bank #0. During the operation of the memory chip 210 in response to the command, the memory controller 100 transmits and receives data or a command to and from a memory chip 210 of the bank #1. Thereby, the memory controller 100 can efficiently operate the memory chips 210 in the different banks #0 and #1 using the same channel. Such a method using different banks may be referred to as bank interleaving.

The number of the memory chips 210 in the memory system 1 is not limited to 16. The number of channels in the memory system 1 is not limited to 4. The number of banks in the memory system 1 is not limited to 4. One NAND controller (to be described later) 140 may be configured to control two or more channels. The number of CPUs 110 in the memory controller 100 is not limited to one for the NAND controllers 140 which correspond to the channels.

The memory controller 100 includes a central processing unit (CPU) 110, a host interface (host I/F) 120, a random access memory (RAM) 130, and four NAND controllers 140 (140-0 to 140-3). For example, the memory controller 100 can be configured as a system-on-a-chip (SoC). The memory controller 100 may constitute of a plurality of chips.

The RAM 130 is a memory that functions as a cache, a buffer, and a working area for the control of the memory controller 100. The RAM 130 stores, for example, data received from the host 2 and not yet transmitted to the NAND memory 200. The RAM 130 stores data read from the NAND memory 200 and not yet transmitted to the host 2.

The type of the memories of the RAM 130 is not limited to a specific type. For example, the RAM 130 can include either or a combination of a dynamic random access memory (DRAM) and a static random access memory (SRAM). The RAM 130 may be provided outside of the memory controller 100.

The four NAND controllers 140 control, for example, different channels. The NAND controllers 140 transmit commands or transmit and receive data to and from the four corresponding memory chips 210 in connection through the corresponding channels. In FIG. 1, one of the NAND controllers 140 that controls a channel #i is denoted by 140-i where "i" is an integer of 0 to 3.

The host I/F 120 controls transmission and reception of information such as an access request, a response, and data between the host 2 and the memory controller 100. For example, the host I/F 120 receives an access request from the host 2. The host I/F 120 receives data from the host 2 and stores it in the RAM 130. The host I/F 120 transmits data, which is read from the NAND memory 200 and is stored in the RAM 130, to the host 2.

The CPU 110 is a processor that operates by a program (firmware program) stored in the memory system 1 in advance. The CPU 110 implements various functions including command generation in accordance with the firmware program. The various functions implemented by the CPU 110 will be described later.

Figure 2:
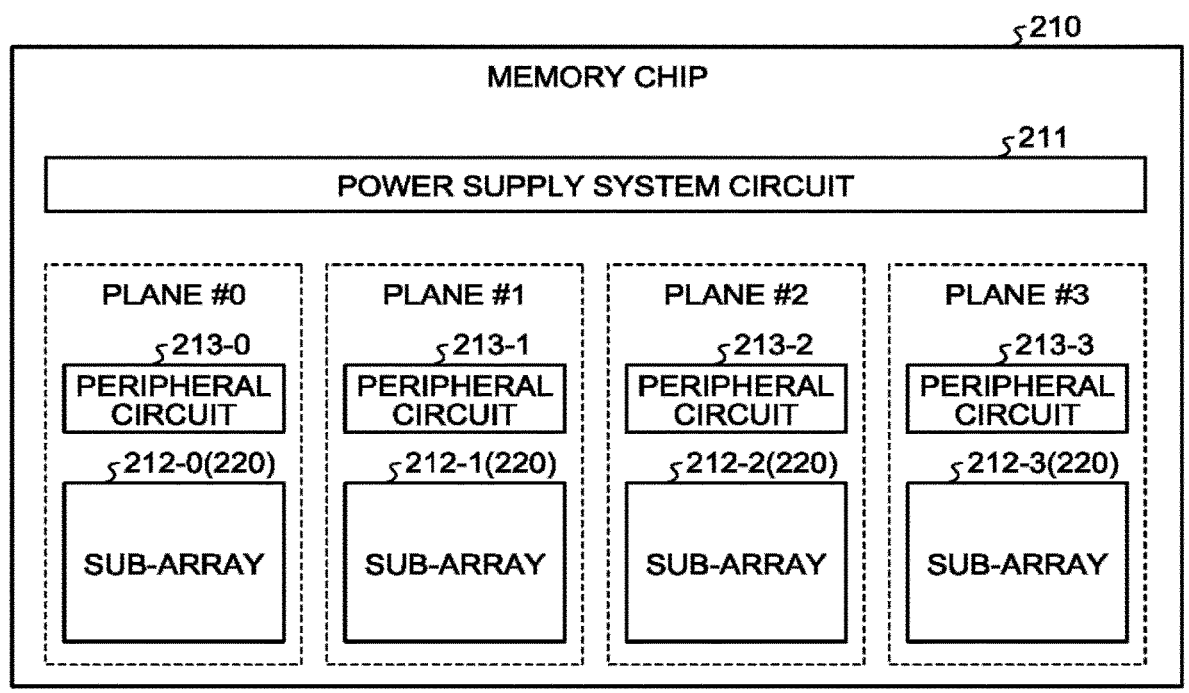
FIG. 2 is a schematic view of a configuration of a memory chip according to the first embodiment.

Next, the configuration of each memory chip 210 will be described. FIG. 2 is a schematic view of the configuration of the memory chip 210 according to the first embodiment.

The memory chip 210 includes a power supply circuit 211. The power supply circuit 211 generates electric power for driving respective elements in the memory chip 210 from electric power supplied from outside. For example, the power supply circuit 211 includes a charge pump.

The memory chip 210 further includes a memory cell array 220 that is divided into four sub-arrays 212 (212-0 to 212-3), and four peripheral circuits 213 (213-0 to 213-3). The number of the sub-arrays 212 is not limited to four.

The sub-arrays 212 are paired with the four peripheral circuits 213, respectively. The pairs of the sub-arrays 212 and the peripheral circuits 213 may be referred to as planes. Each plane can be identified by a plane number. The notation, plane #j is defined to be a plane with a number "j". In FIG. 2, the peripheral circuit 213 in the plane #j is denoted by 213-j. The sub-array 212 in the plane #j is denoted by 212-j. Herein, j is an integer of 0 to 3.

Each peripheral circuit 213 includes, for example, a row decoder, a column decoder, a sense amplifier, and a page buffer. Each of the four planes includes the peripheral circuit 213, thus, the planes can be independently subjected to read operation, unless the channels are used for command, response, and data transmission and reception. That is, the planes can be read asynchronously.

The planes can also be read synchronously. Simultaneous read operations to the planes may be referred to as a multi-plane read. In contrast to the multi-plane read, independent read operations to each of the planes may be referred to as a single-plane read at which a read operation to a single plane is initiated at different timings or the same timing.

The multiple planes can be read asynchronously. That is, upon receipt of a read request for another plane during reading of one plane, a read operation of said another plane can start before completion of the read operation of the one plane. This improves read performance.

Hereinafter, a read operation of one plane asynchronous with that of another plane is referred to as an asynchronous read. A command for causing the memory chip 210 to execute the asynchronous read is referred to as an asynchronous read command.

As described above, the respective planes can be read asynchronously, however, they cannot be subjected to write or erase operations asynchronously.

Specifically, during any of read, write, and erase operation to one plane, write or erase operation to another plane cannot be initiated. The write or erase operation to the planes can be initiated at the same timing. Concurrent write operations to the multiple planes may be referred to as a multi-plane write.

In most cases, read performance has priority over write performance. Thus, the respective planes can be read in asynchronous manner to improve read performance.

To asynchronously execute write or erase operation to the planes, it is necessary for each of the planes to include the power supply circuit 211 in addition to the peripheral circuit 213. When placing the power supply circuit 211 to each plane, the area of one memory chip 210 comes to be close to a total area of a plurality of memory chips 210 each including no planes, therefore the merits of the division of one memory chip 210 into the multiple planes are spoiled.

In the first embodiment, the memory chip 210 is configured such that the respective planes can be asynchronously read but cannot be independently or asynchronously written to, to implement the memory chip 210 having an optimal chip area for attaining higher read performance. Still, the planes may be configured to be writable or erasable independently or asynchronously.

As described above, the four memory chips 210 in the different banks are connected to one channel. Each of the memory chips 210 includes the four planes which can be only read asynchronously among read, write, and erase operations. However, the memory controller 100 cannot simultaneously transmit and receive a command, a response, and data to and from the memory chips 210 through one channel. Thus, the memory system 1 requires an arbitration operation to select a memory chip 210 to access for each channel.

Figure 3:
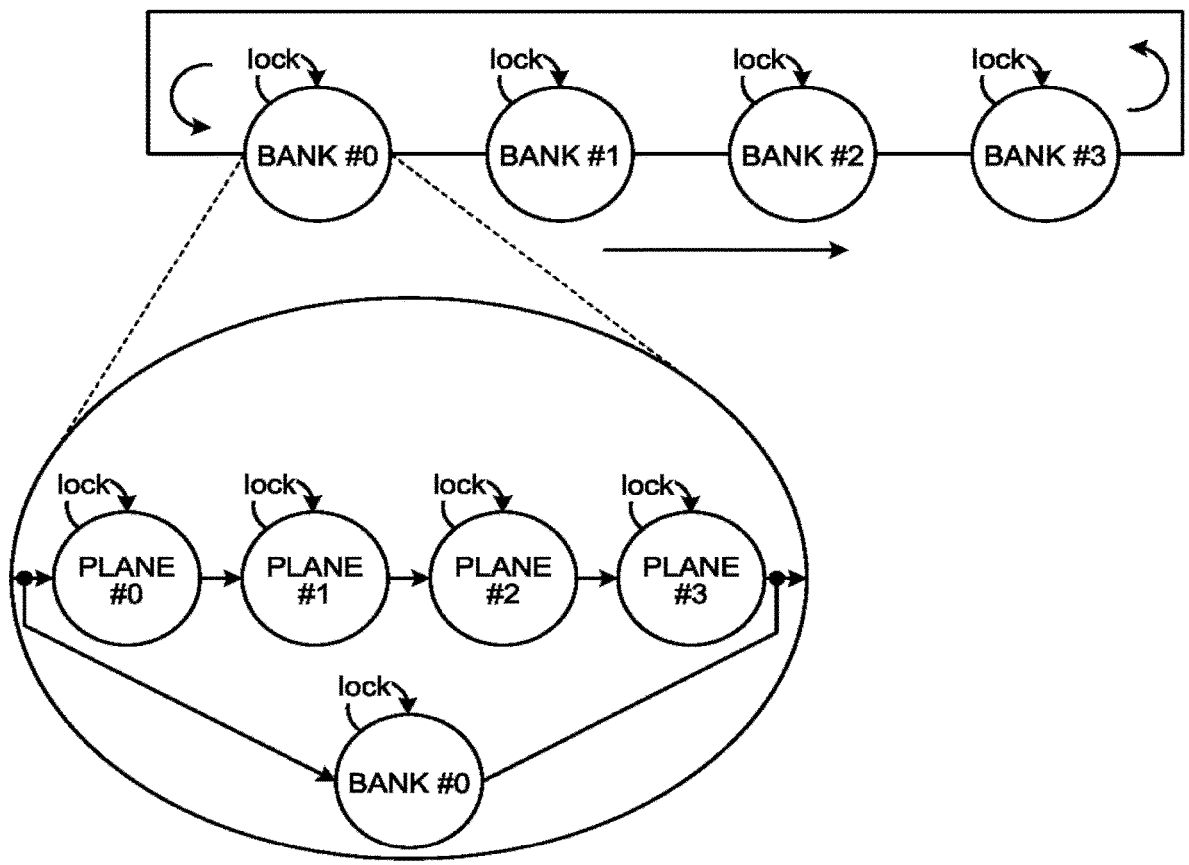
FIG. 3 is a view illustrating an outline of an arbitration operation according to the first embodiment.

FIG. 3 is a view illustrating an outline of the arbitration operation according to the first embodiment.

As illustrated in FIG. 3, the memory controller 100 sets or selects the bank #0, the bank #1, the bank #2, and the bank #3 as access targets in this order. The memory controller 100 sets or selects the bank #0 as an access target after the bank #3. After transmitting a command to the bank to access and during the execution of the operation of the bank in response to the command, the memory controller 100 can switch the bank to access to a next bank.

Arbitrating or setting the access target in a unit of a bank is referred to as a bank arbitration. In the first embodiment, in a single channel each bank is made of one memory chip 210. In the following description, the bank can be read as the memory chip 210.

The memory controller 100 can lock the bank arbitration. Locking the bank arbitration represents setting one bank as an access target and disabling the switch of the access target to a subsequent bank. After releasing the lock, the memory controller 100 can switch the access target to a subsequent bank. In addition, the locking of the bank arbitration may include, for example, a low-level lock function and a high-level lock function. The bank locked by the low-level lock function can be automatically released from being locked if the bank is not ready for a subsequent operation command. The bank locked by the high-level lock function cannot be automatically released even when the bank is not ready for a subsequent operation command. The locking by the high-level lock function is released by the memory controller 100.

Upon selecting one bank (the bank #0 in the example in FIG. 3) as an access target, the memory controller 100 can sequentially set the four planes in the selected bank as an access target. As such, arbitrating the access target in a unit of a plane is referred to as a sub-bank arbitration. When transmitting an asynchronous read command, the memory controller 100 executes the sub-bank arbitration, and when transmitting other commands than the asynchronous read command, the memory controller 100 refrains from executing the sub-bank arbitration. The memory controller 100 may lock the sub-bank arbitration or release the sub-bank arbitration from being locked.

Locking the sub-bank arbitration represents setting the sub-bank arbitration to be repeatedly performed in one bank. The memory controller 100 can terminate the sub-bank arbitration in one bank by releasing the locked sub-bank arbitration.

The sub-bank arbitration using the bank #0 has been described as an example. Needless to say, the memory controller 100 can execute the sub-bank arbitration in the other banks in place of the bank #0.

Figure 4:
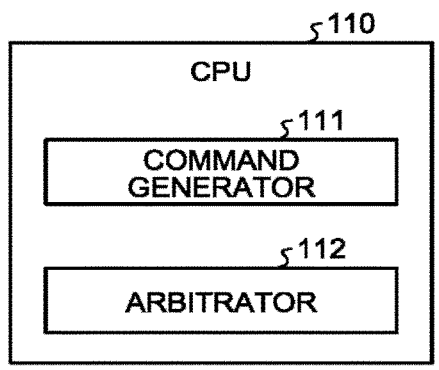
FIG. 4 is a view illustrating a function that is implemented by a CPU according to the first embodiment.

Next, various functions implemented by the CPU 110 by the firmware program will be described. FIG. 4 is a view illustrating a function implemented by the CPU 110 of the first embodiment. As illustrated in the drawing, the CPU 110 functions as a command generator 111 and an arbitrator 112.

The command generator 111 generates a command for the memory chip 210 in response to an access request received form the host 2. The command generator 111 can generate a write command, a read command, and an erase command. The read command includes an asynchronous read command. The command generator 111 transmits the generated command to a NAND controller 140 corresponding to the channel to which a target memory chip 210 is connected. That is, the command generator 111 can generate various commands to distribute commands to the four NAND controllers 140.

Herein, the various commands are generated in the CPU 110. Elements other than the CPU 110 may generate the various commands. For example, the CPU 110 may instruct the four NAND controllers 140 to perform read, write, or erase operations, and the NAND controllers 140 may generate commands for implementing the instructed operations.

Figure 5:
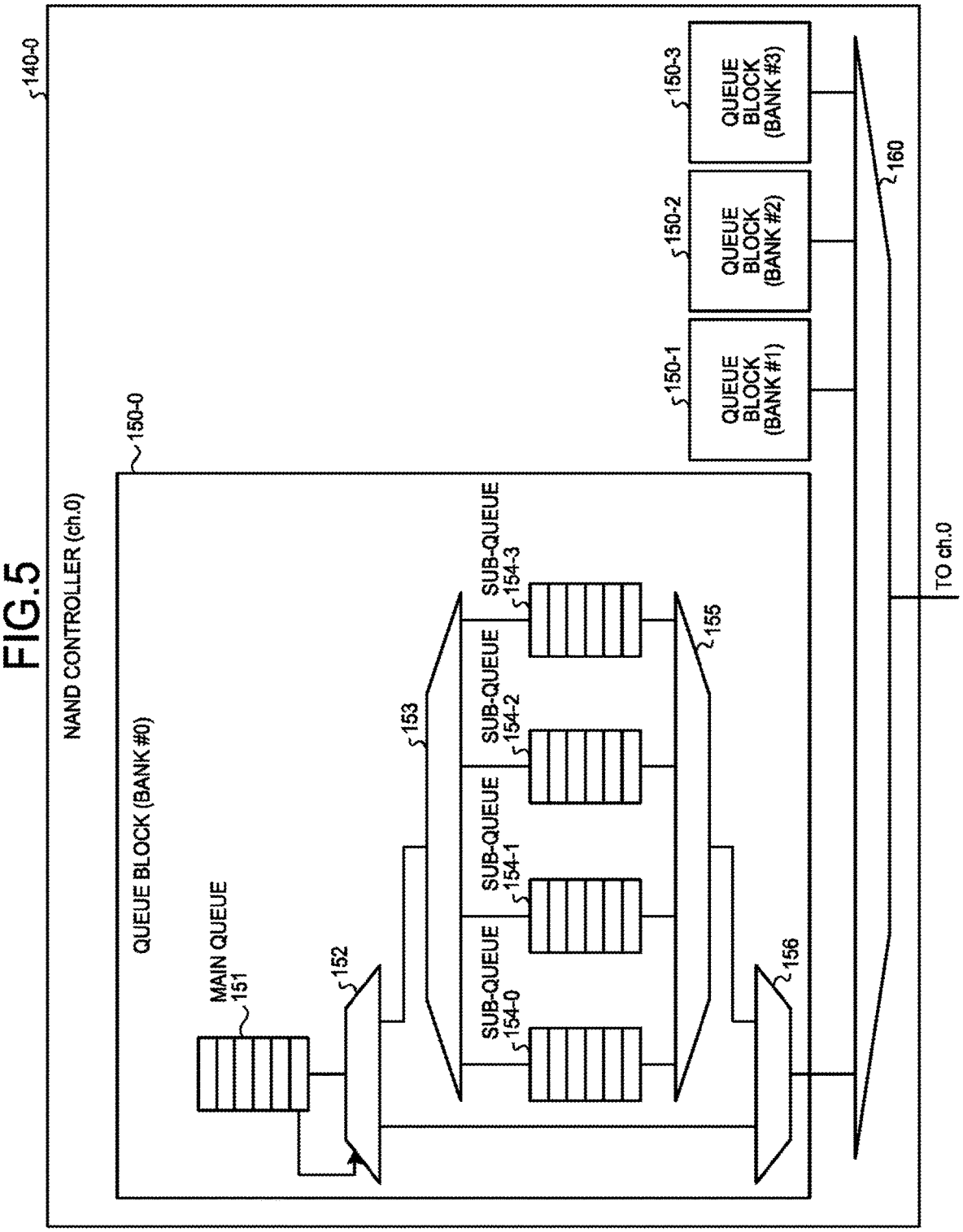
FIG. 5 is a schematic view illustrating an arbiter of a NAND controller, which is controlled by an arbitrator of the first embodiment, according to the first embodiment.

The arbitrator 112 executes the bank arbitration and the sub-bank arbitration. As illustrated in FIG. 5, each of the NAND controllers 140 includes a sub-bank arbiter 155, a bank arbiter 160, and a multiplexer 156. The arbitrator 112 controls these circuits to implement the bank arbitration and the sub-bank arbitration.

Next, the configuration of each NAND controller 140 and the function of the arbitrator 112 for implementing the bank arbitration and the sub-bank arbitration will be described. FIG. 5 is a schematic view illustrating the arbiter of the NAND controller 140 controlled by the arbitrator 112, according to the first embodiment. The four NAND controllers 140 have the same configuration. Herein, the NAND controller 140-0 which controls the channel #0 is described as a representative of the four NAND controllers 140.

As illustrated in FIG. 5, the NAND controller 140-0 includes the four queue blocks 150 (150-0 to 150-3) corresponding to four banks (#0 to #3). In other words, the queue blocks 150 correspond to the four banks (the bank #0 to the bank #3), respectively. A queue block 150 corresponding to a bank #k is referred to as a queue block 150-k where k is an integer of 0 to 3. The four queue blocks 150 have the same configuration, thus, FIG. 5 illustrates a detailed configuration of only the queue block 150-0 corresponding to the bank #0.

Each of the queue blocks 150 receives a command, distributed from the command generator 111, for its corresponding bank, and retains the command in an inside queue (a main queue 151 or a plurality of sub-queues 154) until transmitting the command.

The NAND controller 140-0 further includes a bank arbiter 160. The bank arbiter 160 selects one of the four queue blocks 150 in accordance with a selection signal from the arbitrator 112. The bank arbiter 160 enables the transmission of a command from the selected queue block 150. By such an operation, one of the four banks (the bank #0 to the bank #3) is set or selected as an access target. The bank arbiter 160 implements the bank arbitration by sequentially selecting the four queue blocks 150 in accordance with the selection signal from the arbitrator 112.

The queue block 150-0 includes a main queue 151, a demultiplexer 152, a demultiplexer 153, a sub-bank arbiter 155, and a multiplexer 156.

The main queue 151 is a memory having a first-in first-out (FIFO) structure, for example. The main queue 151 receives a command distributed from the command generator 111.

The queue block 150 includes four sub-queues 154 (154-0 to 154-3) corresponding to the four planes (#0 to #3). A sub-queue 154 corresponding to a plane #m is referred to as a sub-queue 154-*m* where m is an integer of 0 to 3. Each of the sub-queues 154 is a memory having a FIFO structure, for example.

The demultiplexer 152 and the demultiplexer 153 are an example of hardware circuits that determine whether or not a command stored in the main queue 151 matches an asynchronous read command, when the command matches the asynchronous read command, transfer the command to a corresponding sub-queue 154, and when the command does not match the asynchronous read command, refrain from transferring the command in the main queue 151 so that the command remains in the main queue 151.

Specifically, the demultiplexer 152 includes two output terminals. One of the two output terminals is connected to one input terminal of the multiplexer 156. The other of the two output terminals is connected to an input terminal of the demultiplexer 153. The demultiplexer 153 includes four output terminals, and the four output terminals are connected to the four sub-queues 154, respectively.

The demultiplexer 152 selects the output terminal depending on whether or not additional information is added to a command stored in the main queue 151, for example.

Figure 6:
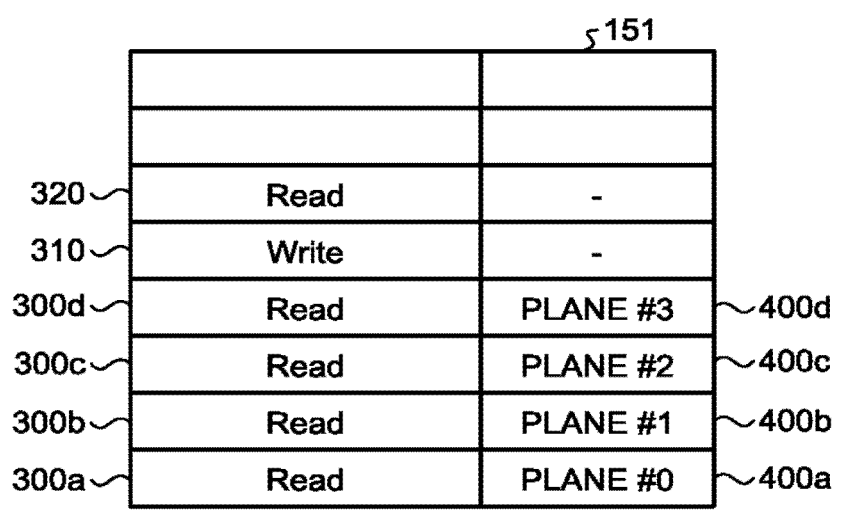

FIG. 6 is a view illustrating an exemplary data structure of various commands stored in the main queue 151 according to the first embodiment. As illustrated in FIG. 6, additional information 400*a* to additional information 400*d*, i.e., plane numbers of target planes, are added to asynchronous read commands 300*a* to 300*d*. A typical read command 320 not being the asynchronous read command is added with no additional information. No additional information is added to a write command 310, either.

In the first embodiment, thus, the additional information is added to the asynchronous read command while no additional information is added to other commands than the asynchronous read command. Determination as to whether or not the command is the asynchronous read command can be made in accordance with presence or absence of the additional information.

Return to FIG. 5. The demultiplexer 152 selects the output terminal connected to the demultiplexer 153 when the command stored at the head of the queue includes the additional information. Through this operation, the command, that is, the asynchronous read command is dequeued from the main queue 151 and is input to the demultiplexer 153 through the selected output terminal.

Upon receipt of the asynchronous read command, the demultiplexer 153 selects the output terminal connected to the sub-queues 154 corresponding to the target plane, on the basis of the added plane number as the additional information. Through this operation, the asynchronous read command is input to the sub-queue 154 corresponding to the target plane.

When the command stored at the head of the main queue 151 contains no additional information, the demultiplexer 152 selects the output terminal connected to the multiplexer 156.

The additional information is not limited to the plane number alone. The additional information to be added to the read command may be a flag indicating whether or not the read command is the asynchronous read command. The demultiplexer 152 may select the output terminal in accordance with the flag. In addition, the demultiplexer 153 may select the output terminal on the basis of address information included in the asynchronous read command.

The demultiplexer 153 may or may not delete the additional information from the asynchronous read command for inputting the asynchronous read command to the sub-queue 154.

The sub-bank arbiter 155 includes four input terminals, and the four input terminal are connected the four sub-queues 154, respectively. The output terminal of the sub-bank arbiter 155 is connected to an input terminal of the multiplexer 156.

The sub-bank arbiter 155 selects one of the four input terminals in accordance with a selection signal from the arbitrator 112. This makes it possible to dequeue the command from the sub-queue 154 connected to the selected input terminal.

The multiplexer 156 includes two input terminals. The output terminal of the demultiplexer 152 is connected to one of the two input terminals. The output terminal of the sub-bank arbiter 155 is connected to the other of the two input terminals.

The multiplexer 156 selects one of the two input terminals in accordance with a selection signal from the arbitrator 112. Upon selection of the input terminal connected to the output terminal of the demultiplexer 152, the command can be transmitted from the main queue 151. Upon selection of the input terminal connected to the sub-bank arbiter 155, the command can be transmitted from the sub-queue 154 selected by the sub-bank arbiter 155.

As described above, the arbitrator 112 supplies selection signals to the sub-bank arbiter 155, the bank arbiter 160, and the multiplexer 156. The arbitrator 112 implements the bank arbitration by switching the input terminals of the bank arbiter 160 in accordance with the selection signal.

In addition, the arbitrator 112 can switch execution and non-execution of the sub-bank arbitration by switching the input terminals of the multiplexer 156 in accordance with the selection signal. Specifically, the arbitrator 112 allows the multiplexer 156 to select the input terminal connected to the demultiplexer 152 so as not to output a command from the sub-queues 154-0 to 154-3, thereby implementing non-execution of the sub-bank arbitration.

The arbitrator 112 can permit the execution of the sub-bank arbitration by allowing the multiplexer 156 to select the input terminal connected to the sub-bank arbiter 155. That is, upon permitting the execution of the sub-bank arbitration, the arbitrator 112 switches the input terminals of the sub-bank arbiter 155 in accordance with the selection signal to implement the sub-bank arbitration.

A determination method of execution and non-execution of the sub-bank arbitration may be designed in any manner. Herein, the arbitrator 112 determines execution and non-execution of the sub-bank arbitration depending on availability of the main queue 151 and the sub-queues 154, by way of example.

More specifically, when any of the sub-queues 154 contains the command, the arbitrator 112 determines the execution of the sub-bank arbitration. When not the sub-queues 154 but the main queue 151 contains the command, the arbitrator 112 determines the non-execution of the sub-bank arbitration.

Next, the operation of the memory system according to the first embodiment will be described.

Figure 7:
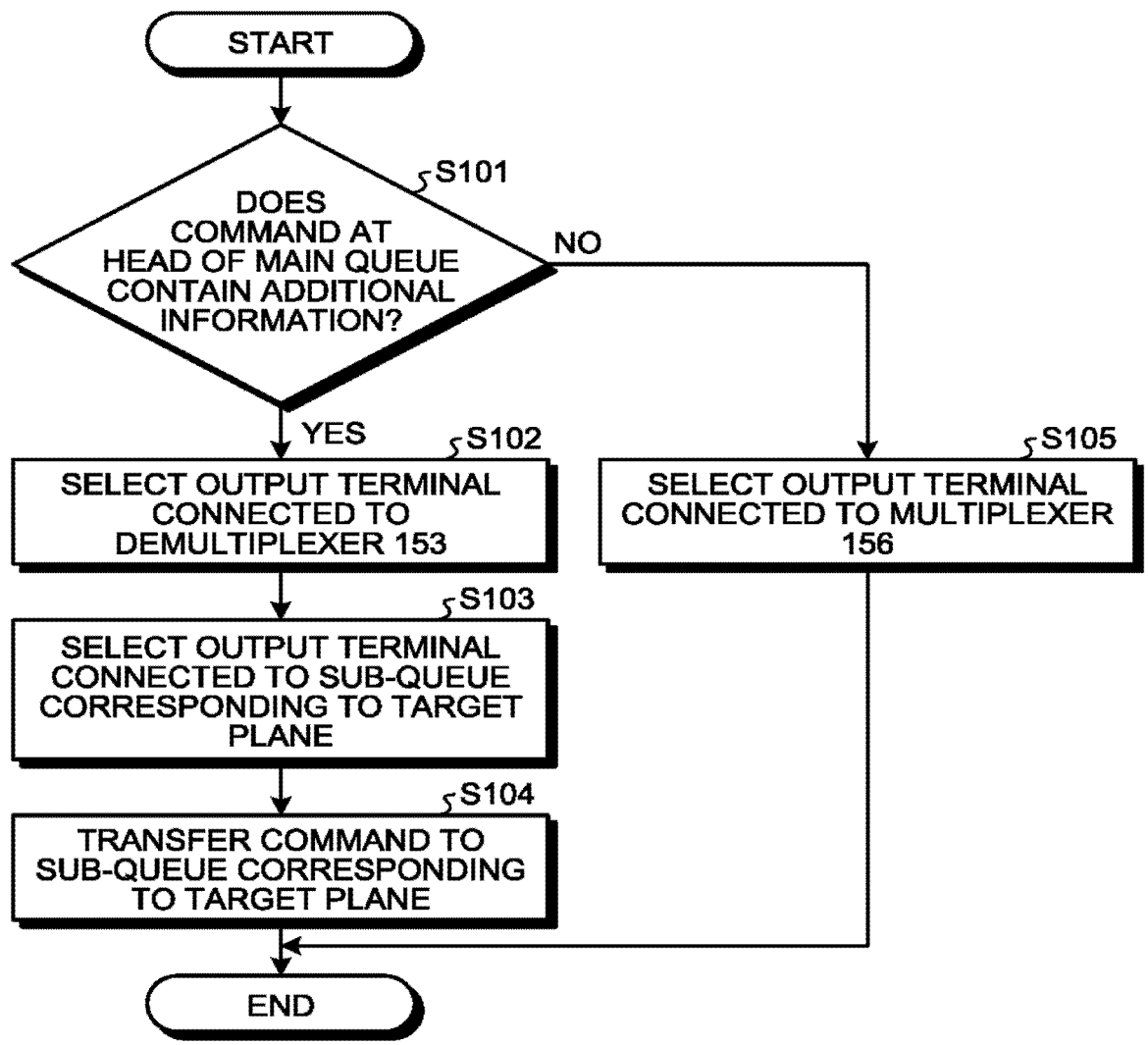
FIG. 7 is a flowchart illustrating a transfer operation of a command according to the first embodiment.

FIG. 7 is a flowchart illustrating a command transfer operation according to the first embodiment. This operation is executed to a command stored at the head of the main queue 151.

When the main queue 151 contains a command at the head, the demultiplexer 152 switches the output terminals in accordance with the additional information of the command. When the command includes the additional information (YES in S101), that is, the command is the asynchronous read command, the demultiplexer 152 selects the output terminal connected to the demultiplexer 153 (S102).

Next, the demultiplexer 153 selects the output terminal connected to the sub-queue 154 corresponding to a plane being a target of the command, in accordance with the plane number being additional information to the command (S103). Thereby, the command is transferred from the main queue 151 to the sub-queue 154 corresponding to the target plane through the demultiplexer 152 and the demultiplexer 153 (S104).

When the command at the head of the main queue 151 includes no additional information (NO in S101), that is, the command is not the asynchronous read command, the demultiplexer 152 selects the output terminal connected to the multiplexer 156 (S105). Thereby, the command remains in the main queue 151 until the command is transmitted from the main queue 151 to a target memory chip 210.

The operation in S104 or S105 completes the command transfer operation.

Figure 8:
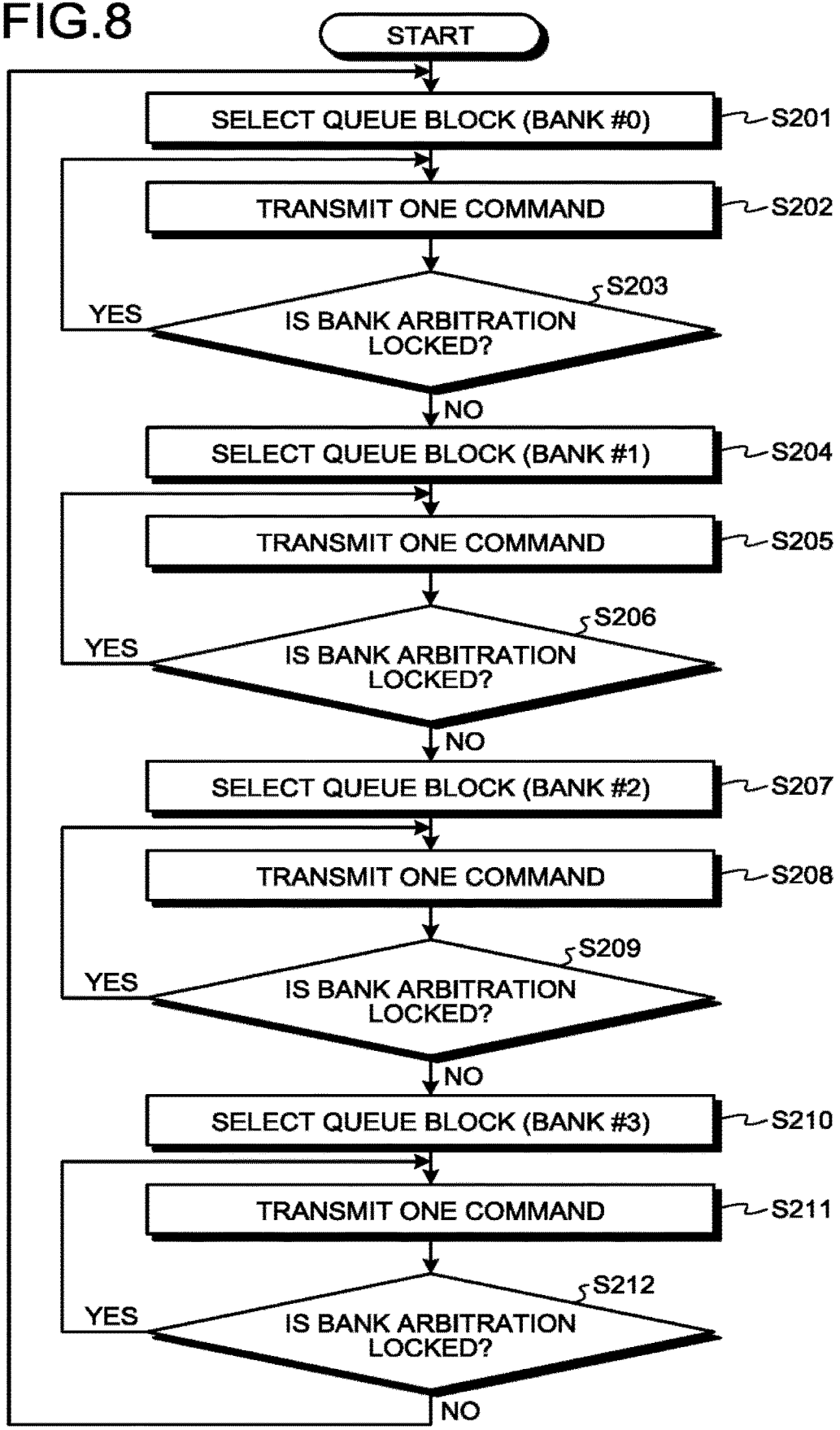
FIG. 8 is a flowchart illustrating an operation of bank arbitration according to the first embodiment.

FIG. 8 is a flowchart illustrating the bank arbitration operation according to the first embodiment.

First, the arbitrator 112 selects the queue block 150-0 corresponding to the bank #0 (S201). Selecting a queue block 150 signifies that the arbitrator 112 transmits to the bank arbiter 160 a selection signal for selecting the input terminal connected to the queue block 150.

The queue block 150-0 transmits one command from a queue of the queue block 150-0 (the main queue 151 or any one of the sub-queues 154) to the NAND memory 200 (S202). The command is transmitted in S305, S307, S309, S311, or S315, as described later. With no queue containing the command, the operation in S202 is skipped.

After S202, the arbitrator 112 determines whether or not the bank arbitration is locked (S203). The bank arbitration may be locked and released from being locked by any circuit with any method.

When determining that the bank arbitration is locked (YES in S203), the arbitrator 112 re-executes the operation in S202.

When determining that the bank arbitration is not locked (NO in S203), the arbitrator 112 selects the queue block 150-1 corresponding to the bank #1 (S204).

The queue block 150-1 transmits one command from its own queue (the main queue 151 or any one of the sub-queues 154) to the NAND memory 200 (S205). When no queue includes the command, the operation in S205 is skipped.

Next, the arbitrator 112 determines whether or not the bank arbitration is locked (S206). When determining that the bank arbitration is locked (YES in S206), the arbitrator 112 re-executes the operation in S205.

When determining that the bank arbitration is not locked (NO in S206), the arbitrator 112 selects the queue block 150-2 corresponding to the bank #2 (S207).

The queue block 150-2 transmits one command from its own queue (the main queue 151 or any one of the sub-queues 154) to the NAND memory 200 (S208). When no queue contains the command, the operation in S208 is skipped.

Next, the arbitrator 112 determines whether or not the bank arbitration is locked (S209). When determining that the bank arbitration is locked (YES in S209), the arbitrator 112 re-executes the operation in S208.

When determining that the bank arbitration is not locked (NO in S209), the arbitrator 112 selects the queue block 150-3 corresponding to the bank #3 (S210).

The queue block 150-3 transmits one command from its own queue (the main queue 151 or any one of the sub-queues 154) to the NAND memory 200 (S211). When no queue contains the command, the operation in S211 is skipped.

Next, the arbitrator 112 determines whether or not the bank arbitration is locked (S212). When determining that the bank arbitration is locked (YES in S212), the arbitrator 112 re-executes the operation in S211.

When determining that the bank arbitration is not locked (NO in S212), the arbitrator 112 selects the queue block 150-1 corresponding to the bank #0 again (S201).

As described above, the arbitrator 112 sequentially selects the queue blocks 150, to sequentially select the banks to access or to be a source of the command. The queue block 150 corresponding to the selected bank to access can transmit one command. While the bank arbitration is locked, the queue block 150 can transmit multiple commands until the bank arbitration is released from being locked.

Figure 9:
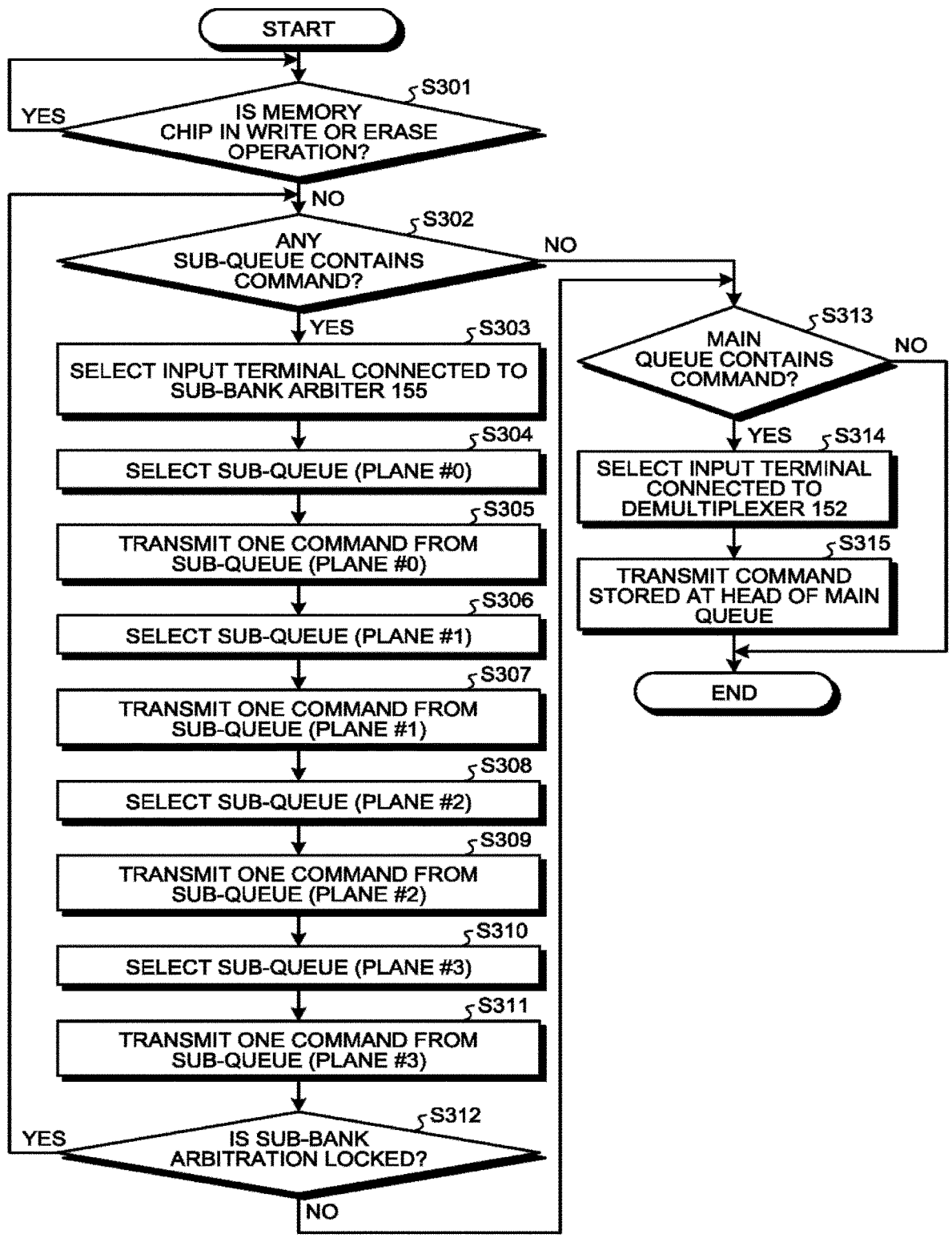
FIG. 9 is a flowchart illustrating an operation of sub-bank arbitration according to the first embodiment.

FIG. 9 is a flowchart illustrating a sub-bank arbitration operation according to the first embodiment. FIG. 9 illustrates the bank arbitration to be performed to a selected queue block 150 to access.

The arbitrator 112 determines whether or not the memory chip 210 being an access target is in a write or erase operation (S301). When determining that the memory chip 210 being the access target is in the write or erase operation (YES in S301), the arbitrator 112 holds a subsequent operation in standby. When determining that the memory chip 210 being the access target is not in the write or erase operation (NO in S301), the arbitrator 112 determines whether or not any of the sub-queues 154 contains a command (S302). When the sub-queue 154 containing the command is found (YES in S302), the arbitrator 112 determines to execute the sub-bank arbitration.

That is, the arbitrator 112 selects, from the input terminals of the multiplexer 156, the one connected to the sub-bank arbiter 155 by controlling the selection signal of the multiplexer 156 (S303).

Next, the arbitrator 112 controls the selection signal of the sub-bank arbiter 155 to select the input terminal connected to the sub-queue 154 corresponding to the plane #0, among the input terminals of the sub-bank arbiter 155. Thereby, the sub-queue 154-0 corresponding to the plane #0 is selected as a source of the command (S304).

After S304, the queue block 150 transmits the command from the head of the sub-queue 154-0 to the target memory chip 210 through the sub-bank arbiter 155, the multiplexer 156, and the bank arbiter 160 (S305). In the case of no command stored in the sub-queue 154-0, the operation in S305 is skipped.

Next, the arbitrator 112 controls the selection signal of the sub-bank arbiter 155 to select the input terminal connected to the sub-queue 154-1 corresponding to the plane #1 from among the input terminals of the sub-bank arbiter 155. Thereby, the sub-queue 154-1 is selected as a source of the command (S306).

After S306, the queue block 150 transmits the command from the head of the sub-queue 154-1 to the target memory chip 210 through the sub-bank arbiter 155, the multiplexer 156, and the bank arbiter 160 (S307). In the case of no command stored in the sub-queue 154-1, the operation in S307 is skipped.

Next, the arbitrator 112 controls the selection signal of the sub-bank arbiter 155 to select the input terminal connected to the sub-queue 154-2 corresponding to the plane #2 from among the input terminals of the sub-bank arbiter 155. Thereby, the sub-queue 154-2 is selected as a source of the command (S308).

After S308, the queue block 150 transmits the command from the head of the sub-queue 154-2 to the target memory chip 210 through the sub-bank arbiter 155, the multiplexer 156, and the bank arbiter 160 (S309). In the case of no command stored in the sub-queue 154-2, the operation in S309 is skipped.

Next, the arbitrator 112 controls the selection signal of the sub-bank arbiter 155 to select the input terminal connected to the sub-queue 154-3 corresponding to the plane #3 from among the input terminals of the sub-bank arbiter 155. Thereby, the sub-queue 154-3 is selected as a source of the command (S310).

After S310, the queue block 150 transmits the command from the head of the sub-queue 154-3 to the target memory chip 210 through the sub-bank arbiter 155, the multiplexer 156, and the bank arbiter 160 (S311). In the case of no command stored in the sub-queue 154-3, the operation in S311 is skipped.

After S311, the arbitrator 112 determines whether or not the sub-bank arbitration is locked (S312). The sub-bank arbitration may be locked and released from being locked by an any circuit at any timing.

When determining that the sub-bank arbitration is locked (YES in S312), the arbitrator 112 re-executes the operation in S302.

When determining that the sub-bank arbitration is not locked (NO in S312), the arbitrator 112 determines whether or not the main queue 151 contains a command (S313).

When determining that the main queue 151 contains no command (NO in S313), the operation is terminated.

When determining that the main queue 151 contains the command (YES in S313), the arbitrator 112 determines whether or not to execute the sub-bank arbitration. That is, the arbitrator 112 controls the selection signal of the multiplexer 156 to select the input terminal connected to the demultiplexer 152 from among the input terminals of the multiplexer 156. Thereby, the main queue 151 is selected instead of the sub-queues 154 as a source of a command (S314).

After S314, the queue block 150 transmits the command from the head of the main queue 151 to the target memory chip 210 through the demultiplexer 152, the multiplexer 156, and the bank arbiter 160 (S315), and the operation is completed.

The following will describe an exemplary arbitration by the arbitration operation configured as explained above according to the first embodiment. Assume that the main queues 151 corresponding to the banks #0 to #3 and the sub-queues 154 corresponding to the four planes of the bank #0 store commands, for example.

In such case, through the arbitration operation according to the first embodiment, the sub-queue 154-0 of the bank #0, the sub-queue 154-1 of the bank #0, the sub-queue 154-2 of the bank #0, the sub-queue 154-3 of the bank #0, the main queue 151 of the bank #0, the main queue 151 of the bank #1, the main queue 151 of the bank #2, and the main queue 151 of the bank #3 are selected in this order as a source of a command.

In this manner, the asynchronous read commands are automatically distributed to the sub-queues 154 in each plane. The arbitrator 112 sequentially selects the sub-queues 154 as a command source through the sub-bank arbitration. The distributed commands are transmitted from the sub-queues 154 at timing at which the sub-queues 154 are selected as the command source. The distributed commands are transmitted and executed regardless of the operation status of the command transmitted from another sub-queue 154, and thus the asynchronous read is implemented.

As described above, the write operations cannot be asynchronously performed to respective planes. The write operation or multi-plane write can be performed to the respective planes while none of the planes is in read, write, or erase operation.

Thus, in the memory system configured to automatically distribute write commands to the sub-queues 154, for example, the queue block 150 needs to monitor command operation statuses of the planes and transmit the distributed write commands from the sub-queues 154 at timing at which no plane is under the execution of a command. That is, this complicates the control of the transmission timing of the distributed commands to the sub-queues 154. In addition, it is necessary to switch controlling and non-controlling of the transmission timing of the commands depending on whether the distributed commands to the sub-queues 154 are either asynchronous read commands or write commands.

As another example, the memory system is configured not to include the sub-queues 154 corresponding to the planes and supply the asynchronous read commands and the write commands from the main queues 151 to a target memory chip 210. This makes it difficult to control the command transmission timing in unit of plane.

In the first embodiment, the write commands remain in the main queue 151 and are sequentially transmitted from the main queue 151. The queue block 150 can transmit the remaining write commands from the main queue 151 at timing at which a target bank is not under the execution of any commands, therefore, does not need to control the transmission timing or determine the types of commands in accordance with the operation statuses of commands in each plane.

Thus, the memory system 1 according to the first embodiment can execute write and asynchronous read operations in a simpler configuration.

The operation status of a command in a memory chip 210 may be checked with any method. For example, the NAND controller 140 may transmit a status read command to the memory chip 210 to acquire status information therefrom, and acquire the operation status of the command in the memory chip 210.

As described above, according to the first embodiment, the queue block 150 includes the main queue 151 and the sub-queues 154 (154-0 to 154-3) corresponding to the planes, respectively. The demultiplexer 152 and the demultiplexer 153 determine whether or not a command contained or enqueued in the main queue 151 is the asynchronous read command. The demultiplexer 152 and the demultiplexer 153 transfer the command from the main queue 151 to the corresponding sub-queue 154 upon determining that the command is the asynchronous read command, and upon determining that the command is not the asynchronous read command, holds the command in the main queue 151. Upon selecting a queue block 150 corresponding to a certain bank as a command source through the bank arbitration, the memory controller 100 selects the main queue 151 or the sub-queues 154 of the selected queue block 150 as the command source.

This makes it possible to execute write and asynchronous read operations in a simpler configuration. That is, a memory system with higher usability is attained.

When any of the sub-queues 154 stores a command, the arbitrator 112 selects the sub-queues 154 as a command source. When none of the sub-queues 154 but the main queue 151 stores a command, the arbitrator 112 selects the main queue 151 as a command source. The command-source selecting method is not limited thereto.

The arbitrator 112 may determine which of the main queue 151 and the sub-queues 154 are to be selected as the command source in accordance with the availability of the main queue 151 or the sub-queues 154.

As one example, the arbitrator 112 may select the main queue 151 as the command source when the main queue 151 stores a command, and may select the sub-queues 154 as the command source when the main queue 151 stores no command.

For another example, the arbitrator 112 may select the sub-queues 154 as the command source when any of the sub-queues 154 stores a command, and may select the main queue 151 as the command source when none of the sub-queues 154 stores a command.

In addition, the arbitrator 112 may select the command source according to a factor other than the availability of the queues 151 and 154.

For example, the arbitrator 112 may select the command source from among the main queues 151 and the sub-queues 154 to transmit the commands from the NAND controller 140 in the order of the commands enqueued in the main queue 151.

In the first embodiment, the demultiplexer 152 and the demultiplexer 153 determine transfer or non-transfer to the sub-queues 154 as to only a command stored at the head of the main queue 151. Thereby, the queue block 150 can transmit commands from the main queue 151 to the memory chip 210 in the same order in which the commands are enqueued therein.

For example, assume that multiple asynchronous read commands are continuously enqueued in the main queue 151, and then a command other than the asynchronous read command is enqueued. The demultiplexer 152 and the demultiplexer 153 transfer all of the asynchronous read commands to the sub-queues 154 until the command other than the asynchronous read command arrives at the head of the main queue 151. Transferred to the sub-queues 154, the asynchronous read commands are transmitted to the memory chip 210 earlier than the command other than the asynchronous read command remaining in the main queue 151, and are executed. After the transmission of all the asynchronous read commands from the sub-queues 154, transmission of the asynchronous read command remaining in the main queue 151 is feasible. That is, the asynchronous read commands continuously enqueued in the main queue 151, and the command other than the asynchronous read command enqueued later are transmitted to the memory chip 210 in the order in which they are enqueued in the main queue 151.

The configuration of the queue block 150 for outputting multiple enqueued commands from the main queue 151 in the enqueuing order is not limited to the above configuration.

In addition, in the first embodiment, the memory controller 100 determines whether or not the memory chip 210 being an access target is in a write or erase operation. Upon determining that the memory chip 210 being the access target is not in the write or erase operation, the memory controller 100 selects the main queue 151 or the sub-queues 154 as a command source.

Thereby, the memory controller 100 can execute write, erase, and asynchronous read operations without a complex configuration, even under the restriction that in a single memory chip 210, an asynchronous read to another plane cannot be initiated during a write or erase operation to one plane.

The first embodiment has described the example that the demultiplexer 152 and the demultiplexer 153 determine whether or not a command stored in the main queue 151 is an asynchronous read command, and transfer the command determined as the asynchronous read command. These operations may be executed by the CPU 110, for example.

Further, the first embodiment has described the example that the arbitrator 112 executes the bank arbitration and the sub-bank arbitration. Either or both of the bank arbitration and the sub-bank arbitration may be executed by a hardware circuit.

Second Embodiment

Hereinafter, a second embodiment will be described. In the second embodiment, description will focus on elements different from those of the first embodiment, and description of the other elements will be omitted.

Figure 10:
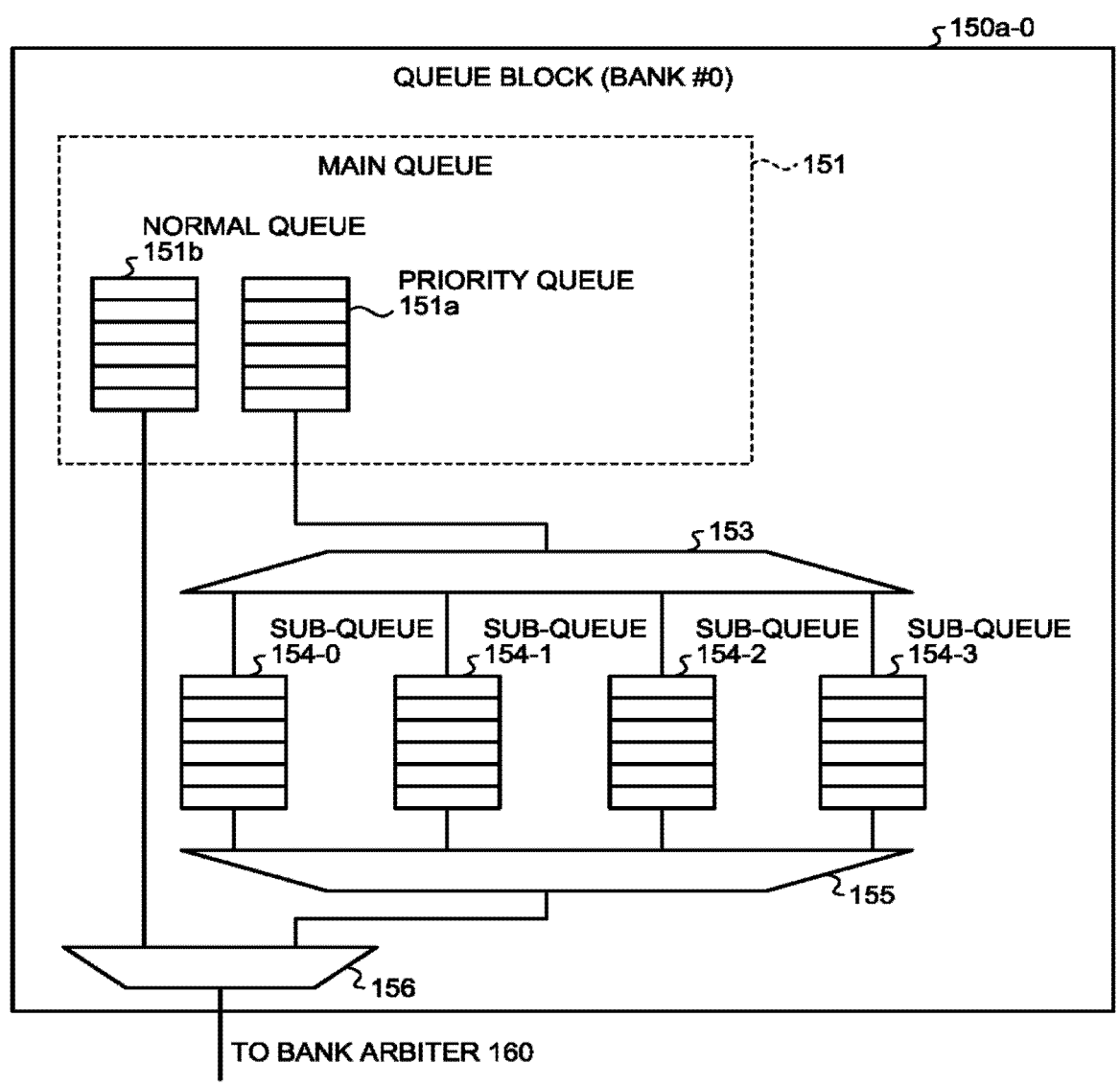
FIG. 10 is a view illustrating an outline of a configuration of a queue block according to a second embodiment.

FIG. 10 is a view illustrating an outline of the configuration of one queue block according to the second embodiment. The queue block according to the second embodiment is referred to as a queue block 150a. As with the NAND controllers 140 according to the first embodiment illustrated in FIG. 5, each of the NAND controllers 140 includes the queue block 150a in each bank. FIG. 10 illustrates the queue block 150a-0 corresponding to the bank #0. Queue blocks 150a corresponding to the other banks have the same configuration as that of the queue block 150a-0.

As illustrated in FIG. 10, a main queue 151 includes a priority queue 151a and a normal queue 151b. The normal queue 151b is a queue containing a command with normal priority, and the priority queue 151a is a queue containing a command with high priority higher than the normal priority.

In the second embodiment, as an example, the command generator 111 stores an asynchronous read command in the priority queue 151a, and stores commands other than the asynchronous read command in the normal queue 151b.

The queue block 150a-0 includes four sub-queues 154 (154-0 to 154-3) corresponding to the four planes #0 to #3 in addition to the main queue 151. The queue block 150a includes a demultiplexer 153, a sub-bank arbiter 155, and a multiplexer 156.

The priority queue 151a is connected to the input terminal of the demultiplexer 153. The demultiplexer 153 includes four output terminals, and the four output terminals are connected to the four sub-queues 154, respectively.

When an asynchronous read command is input to the priority queue 151a, the demultiplexer 153 selects the output terminal connected to the sub-queue 154 corresponding to a target plane in accordance with a plane number being additional information added to the asynchronous read command. Through this operation, the asynchronous read command is input to the sub-queue 154 corresponding to the target plane.

The sub-bank arbiter 155 includes four input terminals, and the four input terminal are connected to the four sub-queues 154, respectively. The output terminal of the sub-bank arbiter 155 is connected to an input terminal of the multiplexer 156.

The sub-bank arbiter 155 selects one of the four input terminals in accordance with a selection signal from the arbitrator 112. This makes it possible to dequeue a command from the sub-queue 154 connected to the selected input terminal.

The multiplexer 156 includes two input terminals. The normal queue 151b is connected to one of the two input terminals. The output terminal of the sub-bank arbiter 155 is connected to the other of the two input terminals.

The multiplexer 156 selects one of the two input terminals in accordance with a selection signal from the arbitrator 112. Upon selection of the input terminal connected to the normal queue 151b, command transmission from the normal queue 151b is feasible. Upon selection of the input terminal connected to the sub-bank arbiter 155, command transmission from the sub-queue 154 selected by the sub-bank arbiter 155 is feasible.

The output terminal of the multiplexer 156 is connected to one of the four input terminals corresponding to the four banks #0 to #3 of the bank arbiter 160 (refer to FIG. 5).

The arbitrator 112 can switch execution and non-execution of the sub-bank arbitration by switching the input terminals of the multiplexer 156 in accordance with the selection signal. Specifically, the arbitrator 112 allows the multiplexer 156 to select the input terminal connected to the normal queue 151b and not to output commands from the sub-queues 154-0 to 154-3. The arbitrator 112 can thus prohibit the execution of the sub-bank arbitration.

The arbitrator 112 can permit the execution of the sub-bank arbitration by allowing the multiplexer 156 to select the input terminal connected to the sub-bank arbiter 155. That is, upon permitting the execution of the sub-bank arbitration, the arbitrator 112 switches the input terminals of the sub-bank arbiter 155 in accordance with the selection signal, to implement the sub-bank arbitration.

In the second embodiment, for example, when any of the sub-queues 154 contains a command, the arbitrator 112 selects one of the two input terminals of the multiplexer 156, the one connected to the sub-bank arbiter 155, to enable transmission of the command from the sub-queue 154. Thus, the arbitrator 112 executes the sub-bank arbitration.

When none of the sub-queues 154 but the normal queue 151b contains a command, the arbitrator 112 selects one of the two input terminals of the multiplexer 156, the one connected to the normal queue 151b.

Thereby, when the command generator 111 stores a command in the normal queue 151b and stores an asynchronous read command in the priority queue 151a, the asynchronous read command can be preferentially executed.

Assume that in the above-configured queue block 150a, the main queues 151 corresponding to the banks #0 to #3 contain commands, and the sub-queues 154 corresponding to the four planes of the bank #0 contain commands. In such a case, through the arbitration operation of the second embodiment, the sub-queue 154-0 of the bank #0, the sub-queue 154-1 of the bank #0, the sub-queue 154-2 of the bank #0, the sub-queue 154-3 of the bank #0, the main queue 151 of the bank #0, the main queue 151 of the bank #1, the main queue 151 of the bank #2, and the main queue 151 of the bank #3 are selected as a command source in this order, as in the first embodiment.

As described above, the command generator 111 stores the asynchronous read command in the priority queue 151a, and stores commands other than the asynchronous read command in the normal queue 151b. The demultiplexer 153 transfers the asynchronous read command from the priority queue 151a to one of the four sub-queues 154 corresponding to a target plane.

As in the first embodiment, the memory system 1 can execute write and asynchronous read operations in a simpler configuration. That is, a memory system with higher usability is attainable.

The command generator 111 may store commands other than the asynchronous read command in the priority queue 151a. In this case, for example, the demultiplexer 153 transfers the commands other than the asynchronous read command from the priority queue 151a to the sub-queue 154 corresponding to a target plane. The sub-queue 154 concerned is locked and arbitration to the sub-queues 154 corresponding to the other planes is prevented, whereby the commands other than the asynchronous read command stored in the priority queue 151a become executable.

If the sub-bank arbitration of the sub-queue 154 containing commands other than the asynchronous read command is locked, the bank arbitration may or may not be locked. Preventing the bank arbitration from being locked can prevent delay in executing commands in the other banks due to the bank being in the execution of a command other than the asynchronous read command.

Third Embodiment

A third embodiment is applicable to the memory system 1 according to the second embodiment. In the third embodiment, if a command is stored in the priority queue 151a during execution of a command stored in the normal queue 151b, the command being executed is suspended, and the command stored in the priority queue 151a is executed.

The command generator 111 can store a command with a suspend flag or a resume flag in the priority queue 151a.

Figure 11:
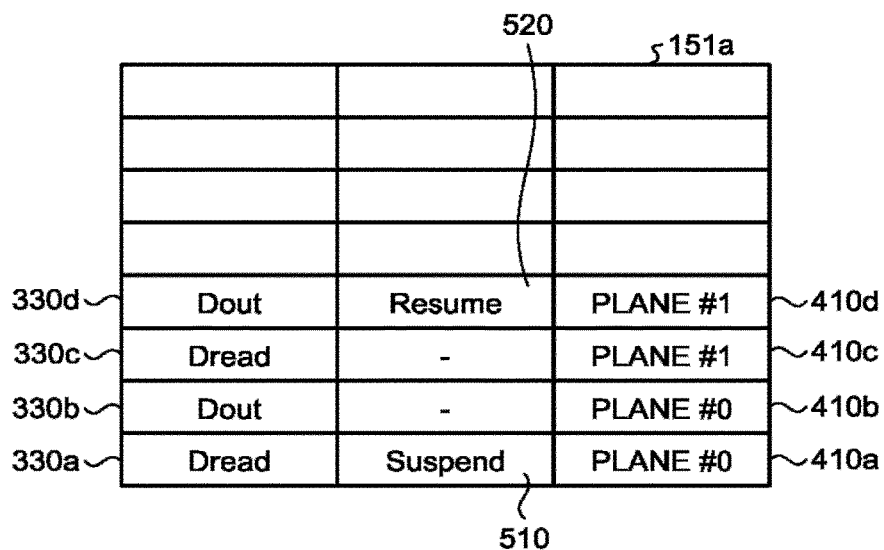
FIG. 11 is a view illustrating an example of a data structure of commands stored in a priority queue according to a third embodiment.

FIG. 11 is a view illustrating an exemplary data structure of commands stored in the priority queue 151a according to the third embodiment.

In the example of FIG. 11, a read command (including an asynchronous read command) includes a pair of a data read command (Dread) and a data out command (Dout). The data read command refers to a command for reading data from a sub-array 212 to the page buffer of the peripheral circuit 213. The data out command refers to a command for transferring data from the page buffer to the NAND controller 140. The asynchronous read command may not be divided into the data read command and the data out command.

In storing multiple commands in the priority queue 151a, the command generator 111 adds a suspend flag 510 to a head command of the commands. The suspend flag 510 functions as a command for suspending a command being executed in the memory chip 210. When receiving the command with the suspend flag 510, the memory chip 210 suspends the command being executed, and executes the received command.

In storing multiple commands in the priority queue 151a, the command generator 111 adds a resume flag 520 to a tail command of the commands. The resume flag 520 functions as a command for restarting the execution of the suspended command in the memory chip 210. When receiving a command with the resume flag 520, the memory chip 210 executes the received command, and restarts the execution of the suspended command after completing the received command.

In the example illustrated in FIG. 11, the priority queue 151a contains, in order from the head, a data read command 330*a* with the suspend flag 510 and addressed to a plane #0, a data out command 330*b* addressed to a plane #0, a data read command 330*c* addressed to a plane #1, and a data out command 330*d* with the resume flag 520 and addressed to the plane #1.

As illustrated in FIG. 11, the commands stored in the priority queue 151*a* are added with plane numbers as additional information 410 (410*a* to 410*d*), as in the first and second embodiments. The commands in the priority queue 151*a* as illustrated in FIG. 11 can be transferred to the sub-queue 154 corresponding to a target plane in accordance with the plane number being the additional information 410.

Figure 12:
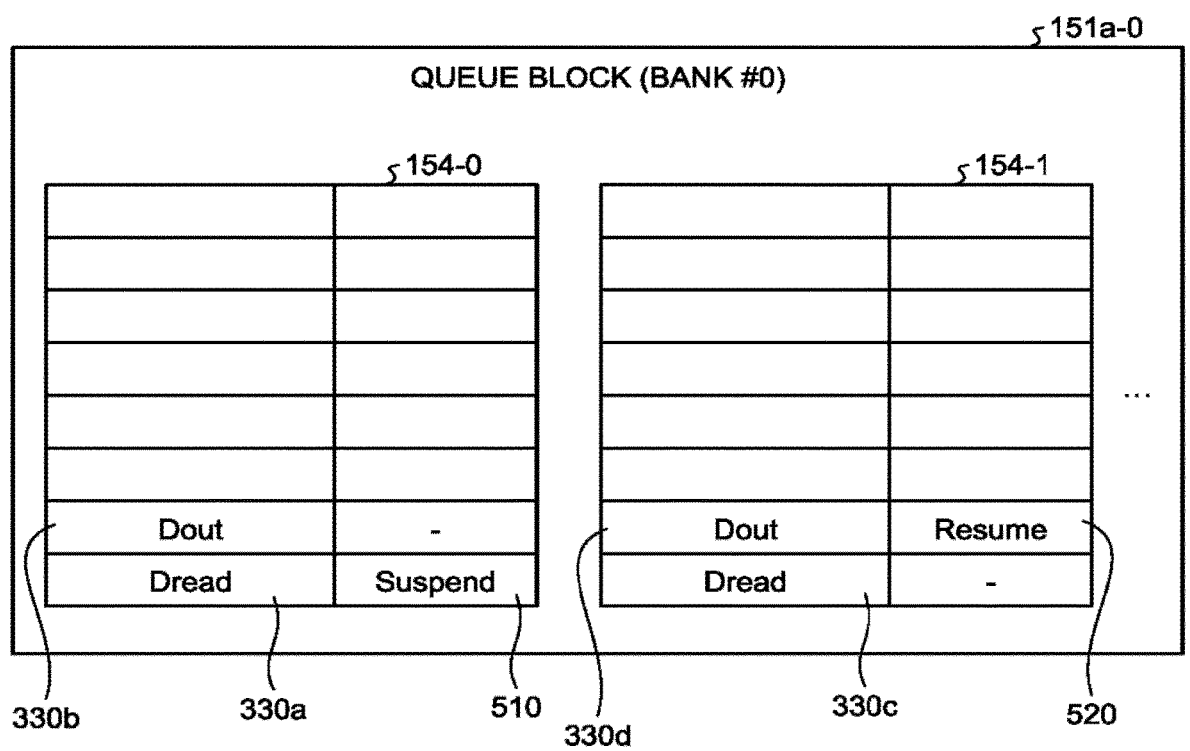
FIG. 12 is a view illustrating an example of command transfer to a sub-queue according to the third embodiment.

FIG. 12 is a view illustrating an exemplary command transfer to the sub-queue 154. As seen from FIG. 12, the commands 330*a* and 330*b*, which are added with the additional information 410*a* and 410*b* indicating the plane #0, are transferred from the priority queue 151*a* to the sub-queue 154-0 corresponding to the plane #0. In addition, the commands 330*c* and 330*d*, which are added with the additional information 410*c* and 410*d* indicating the plane #1, are transferred from the priority queue 151*a* to the sub-queue 154-1 corresponding to the plane #1.

The third embodiment has described the example of adding the suspend flag 510 or the resume flag 520 to the asynchronous read command. In storing multiple commands in the priority queue 151*a*, the command generator 111 may store a suspend command at the head and a resume command at the tail. In this case, the memory controller 100 may transmit the suspend command without using the sub-queues 154, perform the sub-bank arbitration to sequentially select the sub-queues 154 as a command source, and lastly transmit the resume command without using the sub-queues 154.

As configured above, if an asynchronous read command is stored in one of the sub-queues during execution of a command with normal priority, the memory controller 100 can suspend the execution of the command and sequentially select the sub-queues as a command source.

Thus, the memory system 1 can reduce the time taken from the generation of the asynchronous read command to the completion of execution of the asynchronous read command.

According to any of the first to third embodiments, the memory controller 100 includes the main queue 151 that receives a command, and the sub-queues 154 corresponding to the planes of the memory chip 210 for each bank (e.g., memory chip 210). The memory controller 100 automatically transfers the asynchronous read command from the main queue 151 to the sub-queue 154 corresponding to a target plane. Thereby, the memory controller 100 can control both the write operation asynchronously non-executable in the multiple planes, and the read operation asynchronously executable in the multiple planes in a simpler configuration. Thus, a memory system with higher usability is attainable.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
   a memory chip including a plurality of planes;
   a queue block configured to store a command to be transmitted to the memory chip,
   the queue block including a first queue and a plurality of second queues, the second queues respectively corresponding to the planes of the memory chip; and
   a memory controller configured to:
      determine whether or not a first command enqueued in the first queue is a first read command, the first read command being a command for executing a read operation in the planes asynchronously;
      when determining that the first command is the first read command, transfer the first command to one of the second queues corresponding to a plane in which the first command is to be executed;
      when determining that the first command is not the first read command, refrain from transferring the first command from the first queue so that the first command remains in the first queue; and
      select the first queue or the second queues as a command source to be transferred to the memory chip.

2. The memory system according to claim 1, wherein the memory controller is further configured to determine which of the first queue and the second queues is to be selected as the command source, depending on availability of the first queue or the second queues.

3. The memory system according to claim 2, wherein the memory controller is configured to select the second queues as the command source when any of the second queues contains a command, and select the first queue as the command source when none of the second queues contains a command and the first queue contains a command.

4. The memory system according to claim 3, wherein when one or more commands are enqueued in the first queue, the first command is one of the one or more commands located at the head of the first queue.

5. The memory system according to claim 1, wherein the first queue includes a third queue and a fourth queue, and
   the memory controller is further configured to:
      store a third command in the third queue and store a fourth command in the fourth queue, the third command being other than the first read command, the fourth command being the first read command; and
      transfer the fourth command from the fourth queue to one of the second queues, the one second queue corresponding to a plane in which the fourth command stored in the fourth queue is to be executed.

6. The memory system according to claim 5, wherein when any of the second queues contains the fourth command, the memory controller selects the second queues as the command source.

7. The memory system according to claim 5, wherein when the fourth command is stored in any of the second queues during execution of the third command in the memory chip, the memory controller suspends the execution of the third command and selects the second queues as the command source.

8. The memory system according to claim 1, wherein the memory controller determines whether or not the memory chip is in write or erase operation, and, when determining that the memory chip is not in write or erase operation, determines which of the first queue and the second queues is to be selected as the command source.

9. A method of controlling a memory system,
the memory system including:
a memory chip including a plurality of planes; and
a queue block configured to store a command to be transmitted to the memory chip,
the queue block including a first queue and a plurality of second queues, the second queues respectively corresponding to the planes of the memory chip;
the method comprising:
determining whether or not a first command enqueued in the first queue is a first read command, the first read command being a command for executing a read operation in the planes asynchronously;
transferring, when determining that the first command is the first read command, the first command to one of the second queues corresponding to a plane in which the first command is to be executed;
refraining, when determining that the first command is not the first read command, from transferring the first command from the first queue so that the first command remains in the first queue; and
selecting the first queue or the second queues as a command source to be transferred to the memory chip.

10. The method according to claim 9, further comprising determining which of the first queue and the second queues is to be selected as the command source, depending on availability of the first queue or the second queues.

11. The method according to claim 10, further comprising:
selecting the second queues as the command source when any of the second queues contains a command; and
selecting the first queue as the command source when none of the second queues contains a command and the first queue contains a command.

12. The method according to claim 11, wherein
when one or more commands are enqueued in the first queue, the first command is one of the one or more commands located at the head of the first queue.

13. The method according to claim 9, wherein
the first queue includes a third queue and a fourth queue, and
the method further comprises:
storing a third command in the third queue, the third command being other than the first read command;
storing a fourth command in the fourth queue, the fourth command being the first read command; and
transferring the fourth command from the fourth queue to one of the second queues, the one second queue corresponding to a plane in which the fourth command stored in the fourth queue is to be executed.

14. The method according to claim 13, further comprising
selecting, when any of the second queues contains the fourth command, the second queues as the command source.

15. The method according to claim 13, further comprising
suspending, when the fourth command is stored in any of the second queues during execution of the third command in the memory chip, the execution of the third command and selecting the second queues as the command source.

16. The method according to claim 9, further comprising:
determining whether or not the memory chip is in write or erase operation; and
determining, when determining that the memory chip is not in write or erase operation, which of the first queue and the second queues is to be selected as the command source.

* * * * *